(12) United States Patent
Leong

(10) Patent No.: US 11,876,437 B2
(45) Date of Patent: Jan. 16, 2024

(54) MONOLITHIC INTEGRATED HALF-BRIDGE CIRCUIT

(71) Applicant: Infineon Technologies Austria AG, Villach (AT)

(72) Inventor: Kennith Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 12 days.

(21) Appl. No.: 17/683,398

(22) Filed: Mar. 1, 2022

(65) Prior Publication Data
US 2023/0283166 A1 Sep. 7, 2023

(51) Int. Cl.
| | |
|---|---|
| H02M 1/088 | (2006.01) |
| H03K 17/687 | (2006.01) |
| H01L 27/06 | (2006.01) |
| H01L 29/20 | (2006.01) |
| H01L 29/778 | (2006.01) |

(52) U.S. Cl.
CPC ........ H02M 1/088 (2013.01); H01L 27/0605 (2013.01); H01L 27/0629 (2013.01); H01L 29/2003 (2013.01); H01L 29/7786 (2013.01); H03K 17/6871 (2013.01); *H03K 2217/0063* (2013.01); *H03K 2217/0072* (2013.01)

(58) Field of Classification Search
CPC ............... H02M 1/088; H01L 27/0605; H01L 29/2003; H03K 17/6871; H03K 2217/0063; H03K 2217/0072
See application file for complete search history.

(56) References Cited

U.S. PATENT DOCUMENTS

| | | | |
|---|---|---|---|
| 10,536,140 B1* | 1/2020 | Ribarich | H03K 17/0822 |
| 2011/0006361 A1* | 1/2011 | Darwish | H01L 29/7816 |
| | | | 257/329 |
| 2012/0182069 A1* | 7/2012 | Stanley | H03F 3/2173 |
| | | | 330/251 |
| 2017/0170821 A1* | 6/2017 | Marini | H01L 29/2003 |
| 2017/0221885 A1* | 8/2017 | Sander | H01L 29/41766 |

OTHER PUBLICATIONS

Xiangdong Li, et al., "Suppression of the Backgating Effect of Enhancement-Mode p-GaN HEMTs on 200-mm GaN-on-SOI for Monolithic Integration", IEEE Electron Device Letters, vol. 39, No. 7, Jul. 2018, pp. 999-1002.

* cited by examiner

*Primary Examiner* — Metasebia T Retebo
(74) *Attorney, Agent, or Firm* — COOPER LEGAL GROUP, LLC

(57) ABSTRACT

According to some embodiments, a half-bridge circuit is provided. The half-bridge circuit includes a substrate, a monolithic die over the substrate, a switch node, a high-side switch integrated with the monolithic die and coupled to the switch node, and a conductive structure including a first terminal coupled to the substrate and a second terminal coupled to the switch node.

20 Claims, 4 Drawing Sheets

MONOLITHIC INTEGRATED HALF-BRIDGE CIRCUIT

TECHNICAL FIELD

The present disclosure relates generally to voltage converters.

BACKGROUND

A voltage converter is an electric power converter that alters the voltage of an electrical power source. When combined with extra circuitry or electronic components, the converter is sometimes used as a power supply. The term "voltage converter" includes voltage regulators and voltage inverter devices.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a half-bridge circuit is provided. The half-bridge circuit includes a substrate, a monolithic die over the substrate, a switch node, a high-side switch integrated with the monolithic die and coupled to the switch node, and a conductive structure including a first terminal coupled to the substrate and a second terminal coupled to the switch node.

According to some embodiments, a half-bridge circuit is provided. The half-bridge circuit includes a substrate, a monolithic die over the substrate, a high-side switch integrated with the monolithic die, wherein the high-side switch is laterally conducting, a low-side switch integrated with the monolithic die, wherein the low-side switch is laterally conducting, a source region of the high-side switch, a drain region of the low-side switch, and a switch node, wherein the source region of the high-side switch is coupled to the switch node, the drain region of the low-side switch is coupled to the switch node, and the switch node is at a first voltage potential that is equal to a second voltage potential of the substrate.

According to some embodiments, a half-bridge circuit is provided. The half-bridge circuit incudes a substrate, a monolithic die over the substrate, a high-side switch integrated with the monolithic die and coupled to a switch node, and a low-side switch integrated with the monolithic die and coupled to the switch node, wherein the switch node is at a first voltage potential that is equal to a second voltage potential of the substrate.

To the accomplishment of the foregoing and related ends, the following descriptions and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
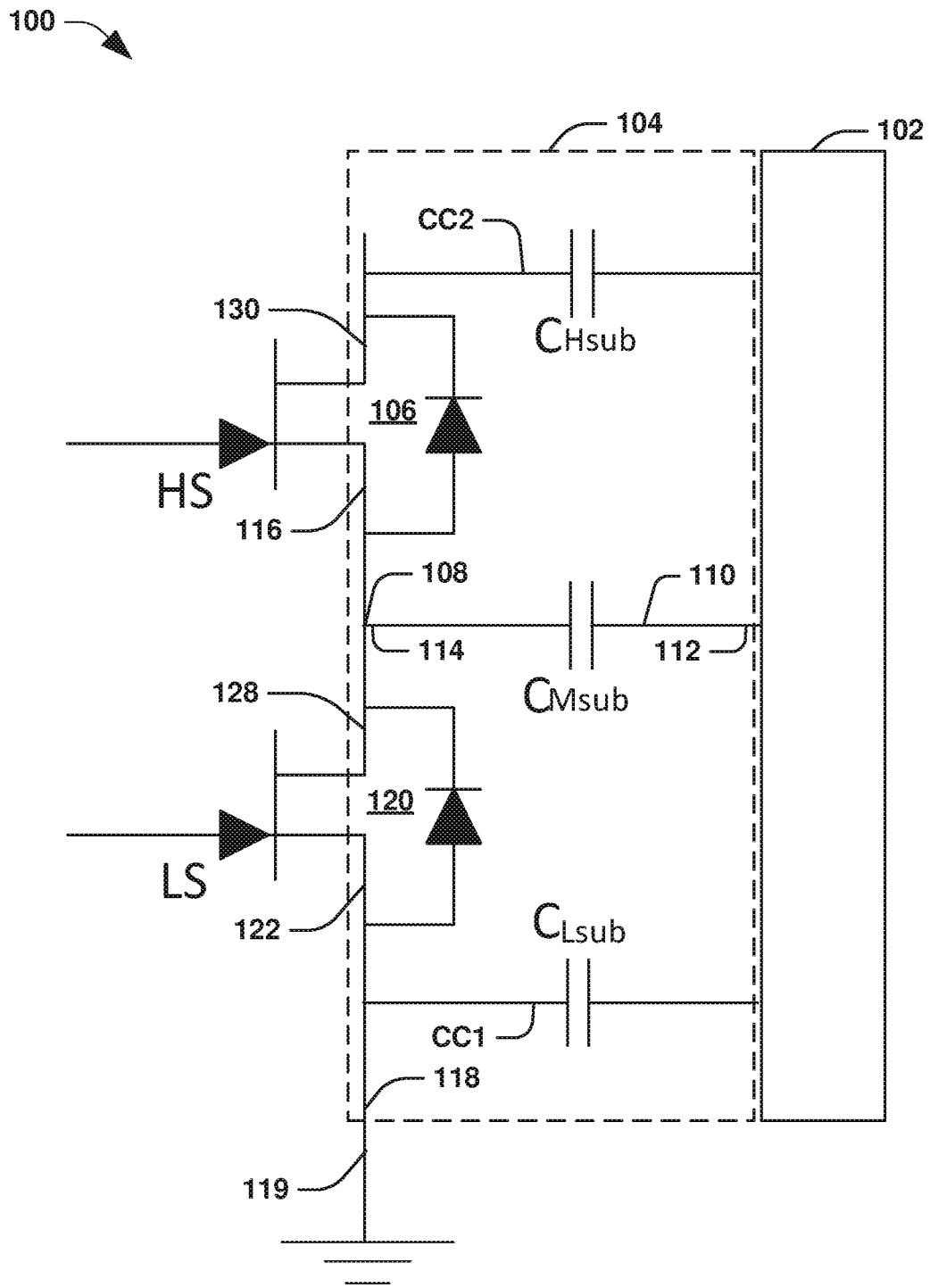
FIG. 1 illustrates an embodiment of a half-bridge circuit, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

In some circuit configurations, voltages undesirably appear across circuit elements and/or appear across circuit elements at undesired values, magnitudes, etc. Such voltages can damage circuitry, cause undesired operation of circuitry, etc. In some circuit arrangements, a substrate is maintained at or near a certain voltage, such as ground or zero volts, in an effort to control such voltages. However, maintaining a substrate at or near certain voltages can have undesired effects in certain situations. Accordingly, in at least some embodiments provided herein the substrate is disconnected from ground or other potential. Instead, a switch node is connected to the substrate and/or a capacitance between the switch node and the substrate is increased to control, such as reduce, a voltage.

FIG. 1 illustrates an embodiment of a half-bridge circuit 100, according to some embodiments. The half-bridge circuit 100 comprises a monolithic die 104 over a substrate 102. In some embodiments, the monolithic die 104 comprises gallium nitride. A high-side switch 106 is integrated with the monolithic die 104 and is coupled to a switch node 108. The high-side switch 106 is generally in an off, open, non-conducting, etc. state unless otherwise acted upon. Although a body diode is depicted in parallel with the high-side switch 106 such a diode may not be present, particularly if the switch 106 comprises a high-electron-mobility transistor (e.g., because high-electron-mobility transistors generally do not comprise a body diode). A conductive structure 110 comprises a first terminal 112 and a second terminal 114. The first terminal 112 and a second terminal 114 are inherently capacitively coupled ($C_{Msub}$) to one another. The first terminal 112 is coupled to the substrate 102. The second terminal 114 is coupled to the switch node 108. A source region 116 of the high-side switch 106 is coupled to the switch node 108. A drain region 130 of the high-side switch 106 is inherently capacitively coupled ($C_{Hsub}$) to the substrate 102. In some embodiments, the conductive structure 110 is within the monolithic die 104. In some embodiments, the conductive structure 110 is external to the monolithic die 104.

A low-side switch 120 is integrated with the monolithic die 104. The low-side switch 120 is generally in an off, open, non-conducting, etc. state unless otherwise acted upon. Although a body diode is depicted in parallel with the low-side switch 120 such a diode may not be present, particularly if the switch 120 comprises a high-electron-mobility transistor (e.g., because high-electron-mobility transistors generally do not comprise a body diode). A drain region 128 of the low-side switch 120 is coupled to the switch node 108. A source region 122 of the low-side switch 120 is inherently capacitively coupled ($C_{Lsub}$) to the substrate 102. A third terminal 118 of the half-bridge circuit 100 is coupled to the source region 122 of the low-side switch 120 and to a low potential voltage source 119. In some embodiments, the low potential voltage source 119 is at ground potential.

The voltage across $C_{Hsub}$ will follow the voltage across the high-side switch 106 when the high-side switch 106 is ON. The same goes for $C_{Lsub}$ and the low-side switch 120. When the high-side switch 106 is ON, the substrate is now at a first voltage in reference to ground and the first voltage is applied across $C_{Lsub}$ while the low-side switch 120 is OFF. Because the substrate 102 and the high-side switch 106 are now effectively at the same potential, there will be little to no electric field across the active region of the device and substrate 102. Dynamic RDSon effects are only limited to how fast the high-side switch 106 is discharged from a voltage greater than zero to zero. In some embodiments, the high-side switch 106 is discharged within a few nano seconds and can be further improved by isolation means. When the low-side switch 120 is ON and the high-side switch 106 is OFF, the substrate 102 is at the same voltage potential as ground. In this case, the dynamic RDSon effects are only limited to how fast $C_{Lsub}$ is discharged from a voltage greater than zero to zero. In the fully OFF state when both the high-side switch 106 and the low-side switch 120 are OFF, the high-side switch 106 and $C_{Lsub}$ form a voltage divider and the voltage is divided across $C_{Hsub}$ and $C_{Lsub}$.

Figure 2:
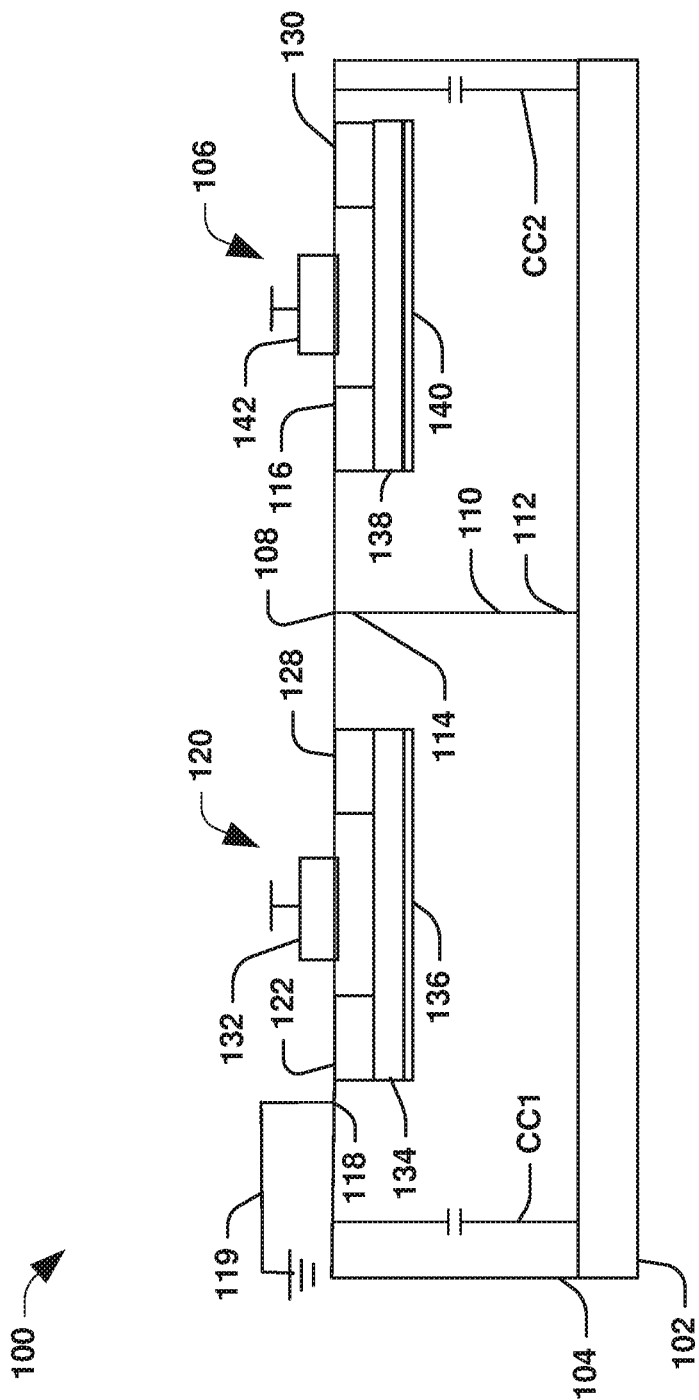
FIG. 2 is a cross-sectional view of a half-bridge circuit, according to some embodiments.

FIG. 2 is a cross-sectional view of the half-bridge circuit 100, according to some embodiments. Several components of the half-bridge circuit 100 illustrated in FIG. 1 are represented in FIG. 2 in cross-sectional format. Some of the same or similar components illustrated in FIG. 1 are not illustrated in FIG. 2.

The conductive structure 110 is coupled to the first terminal 112 and the second terminal 114. The second terminal 114 is coupled to the switch node 108. The switch node 108 is coupled to the source region 116 of the high-side switch 106 and to the drain region 128 of the low-side switch 120. At least one of the high-side switch 106 or the low-side switch 120 is generally in an off, open, non-conducting, etc. state unless otherwise acted upon. A first wide band gap region 134 of the low-side switch 120 is coupled to the drain region 128 of the low-side switch 120 and to the source region 122 of the low-side switch 120. A first two-dimensional channel 136 underlies the first wide band gap region 134. A first gate 132 overlies the first two-dimensional channel 136. In some embodiments the low-side switch 120 and the high-side switch 106 are laterally conducting field-effect transistors. In some embodiments, the high-side switch 106 comprises a high-electron-mobility transistor.

The high-side switch 106 includes a second gate 142 overlying a second wide band gap region 138. The second wide band gap region 138 overlies a second two-dimensional channel 140.

Figure 3:
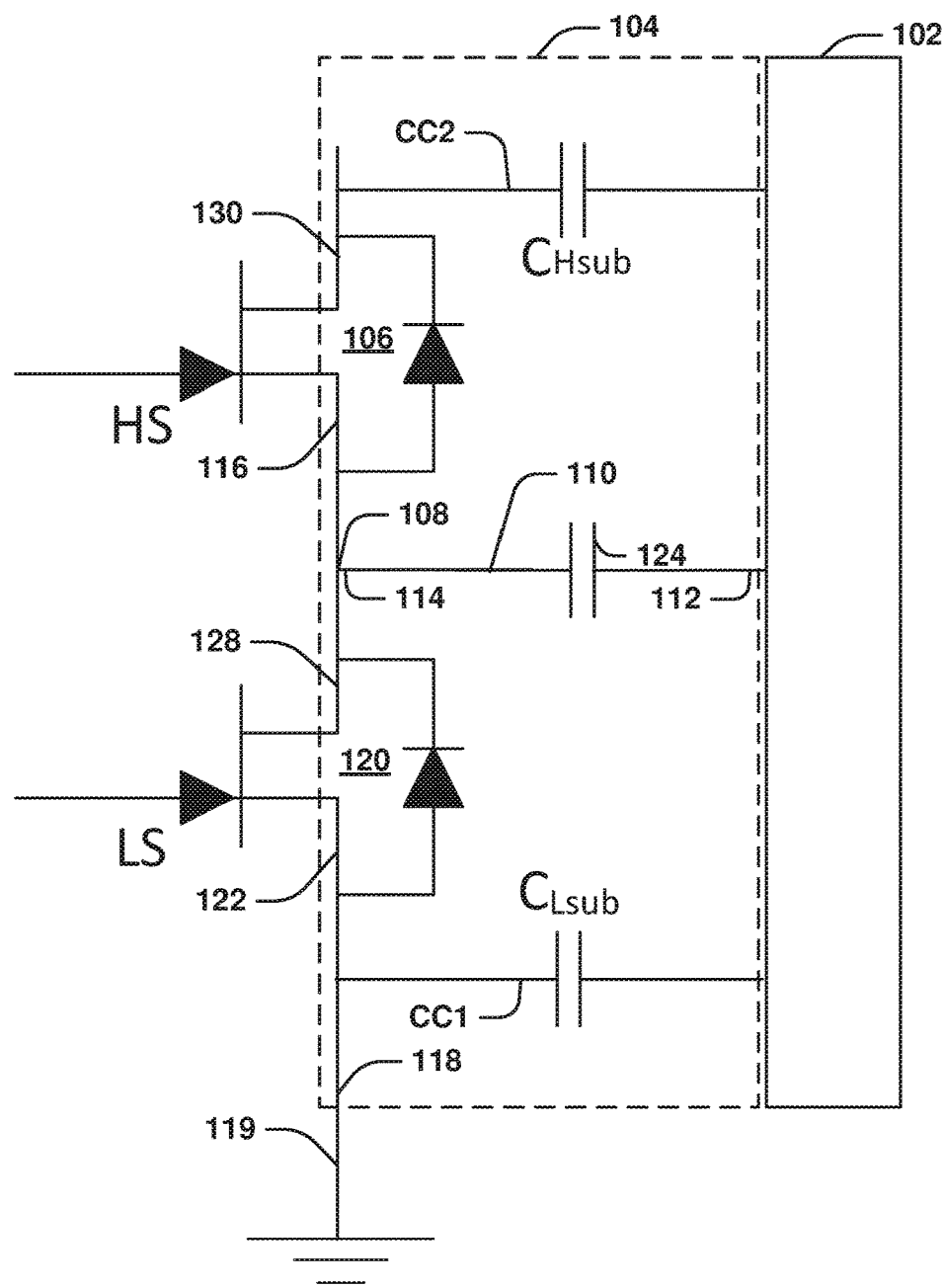
FIG. 3 illustrates an embodiment of a half-bridge circuit, according to some embodiments.

FIG. 3 illustrates an embodiment of the half-bridge circuit 100, according to some embodiments. At least some of the half-bridge circuit 100 illustrated in FIG. 3 is identical to the half-bridge circuit 100 illustrated in FIG. 1, with the exception of the conductive structure 110. The conductive structure 110 illustrated in FIG. 1 is a conductor. The conductive structure 110 illustrated in FIG. 3 includes a capacitor 124 that may be implemented if the substrate 102 cannot be directly coupled to the switch node 108. In the half-bridge circuit 100 illustrated in FIG. 3, the capacitance of the capacitor 124 is much greater than the capacitance $C_{Lsub}$ and much greater than the capacitance of $C_{Hsub}$ in order to keep the voltage across the switch node 108 and the substrate 102 below a second voltage. In some embodiments, the voltage across the switch node 108 and the substrate 102 may be below half of the second voltage. In some embodiments, the capacitance of the capacitor 124 is twenty-times higher than the capacitance $C_{Lsub}$ and the capacitance $C_{Hsub}$.

Figure 4:
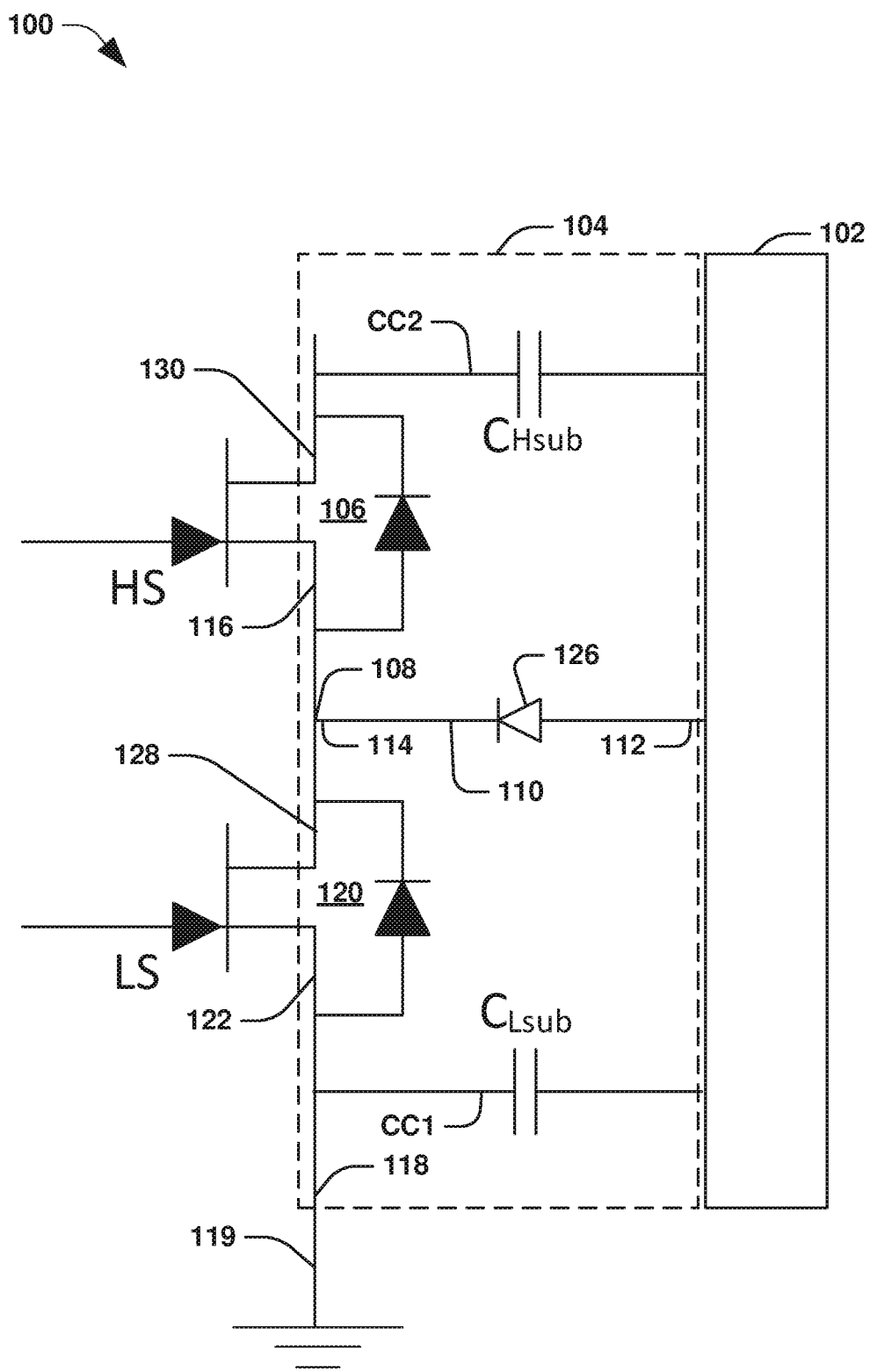
FIG. 4 illustrates an embodiment of a half-bridge circuit, according to some embodiments.

FIG. 4 illustrates an embodiment of a half-bridge circuit 100, according to some embodiments. At least some of the half-bridge circuit 100 illustrated in FIG. 4 is identical to the half-bridge circuit 100 illustrated in FIG. 1, with the exception of the conductive structure 110. The conductive structure 110 illustrated in FIG. 1 is a conductor. The conductive structure 110 illustrated in FIG. 4 includes a diode 126 that may be implemented if the substrate 102 cannot be directly coupled to the switch node 108. In the half-fbridge circuit 100 illustrated in FIG. 4 the capacitance of the diode 126 is much greater than the capacitance $C_{Lsub}$ and much greater than the capacitance of $C_{Hsub}$ in order to keep the voltage across the switch node 108 and the substrate 102 below a third voltage. In some embodiments, the voltage across the switch node 108 and the substrate 102 may be below half of the third voltage. In some embodiments, the capacitance of the diode 126 is twenty-times higher than the capacitance $C_{Lsub}$ and the capacitance $C_{Hsub}$.

In the embodiments illustrated in FIG. 3 and FIG. 4, the capacitance across the capacitor 124 or the diode 126 is much larger than the capacitance $C_{Hsub}$ and the capacitance $C_{Lsub}$.

When the high-side switch 106 is ON, most of the voltage is applied across $C_{Lsub}$ because $C_{Msub}$ (illustrated in FIG. 1) is much larger. $C_{Hsub}$ is now effectively in parallel with $C_{Msub}$. Therefore the voltage across $C_{Msub}$ and $C_{Hsub}$ is the same. The ratio of the voltage may be control by the size of $C_{Msub}$. When the low-side switch 120 is ON, most of the voltage is applied across $C_{Hsub}$ and the rest of the voltage is shared across $C_{Msub}$ and $C_{Lsub}$. When both the high-side switch 106 and the low-side switch 120 are off, $C_{Hsub}$ and $C_{Lsub}$ approximately split the DC bus in half.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

According to some embodiments, a half-bridge circuit is provided. The half-bridge circuit includes a substrate, a monolithic die over the substrate, a switch node, a high-side switch integrated with the monolithic die and coupled to the switch node, and a conductive structure including a first terminal coupled to the substrate and a second terminal coupled to the switch node.

According to some embodiments, the half-bridge circuit includes a source region of the high-side switch, wherein the switch node is coupled to the source region of the high-side switch.

According to some embodiments, the monolithic die comprises gallium nitride.

According to some embodiments, the conductive structure is within the monolithic die.

According to some embodiments, the conductive structure is external to the monolithic die.

According to some embodiments, the half-bridge circuit includes a third terminal and a low-side switch integrated with the monolithic die and coupled to the third terminal.

According to some embodiments, the half-bridge circuit includes a source region of the low-side switch, wherein the substrate is capacitively coupled (CC1) to the source region of the low-side switch.

According to some embodiments, the low-side switch and the high-side switch are laterally conducting field-effect transistors.

According to some embodiments, the half-bridge circuit includes a capacitor, wherein the capacitor is coupled to the first terminal and the second terminal, and a capacitance of the capacitor is at least 20-times greater than a capacitance between the low-side switch and the substrate and at least 20-times greater than a capacitance between the high-side switch and the substrate.

According to some embodiments, the half-bridge circuit includes a diode, wherein the diode is coupled to the first terminal and the second terminal, and a capacitance of the diode is at least 20-times greater than a capacitance between the low-side switch and the substrate and at least 20-times greater than a capacitance between the high-side switch and the substrate.

According to some embodiments, the high-side switch comprises a high-electron-mobility transistor.

According to some embodiments, a half-bridge circuit is provided. The half-bridge circuit includes a substrate, a monolithic die over the substrate, a high-side switch integrated with the monolithic die, wherein the high-side switch is laterally conducting, a low-side switch integrated with the monolithic die, wherein the low-side switch is laterally conducting, a source region of the high-side switch, a drain region of the low-side switch, and a switch node, wherein the source region of the high-side switch is coupled to the switch node, the drain region of the low-side switch is coupled to the switch node, and the switch node is at a first voltage potential that is equal to a second voltage potential of the substrate.

According to some embodiments, the half-bridge circuit includes a conductive structure having a first terminal coupled to the substrate and a second terminal coupled to the switch node.

According to some embodiments, the conductive structure has a capacitor between the first terminal and the second terminal, and a capacitance of the capacitor is at least 20-times greater than a capacitance between the low-side switch and the substrate and at least 20-times greater than a capacitance between the high-side switch and the substrate.

According to some embodiments, the conductive structure comprises a diode between the first terminal and the second terminal, and a capacitance of the diode is at least 20-times greater than a capacitance between the low-side switch and the substrate and at least 20-times greater than a capacitance between the high-side switch and the substrate.

According to some embodiments, the monolithic die comprises gallium nitride.

According to some embodiments, a half-bridge circuit is provided. The half-bridge circuit incudes a substrate, a monolithic die over the substrate, a high-side switch integrated with the monolithic die and coupled to a switch node, and a low-side switch integrated with the monolithic die and coupled to the switch node, wherein the switch node is at a first voltage potential that is equal to a second voltage potential of the substrate.

According to some embodiments, the half-bridge circuit includes a conductive structure having a first terminal coupled to the substrate and a second terminal coupled to the switch node.

According to some embodiments, the low-side switch is capacitively coupled (CC1) to the substrate, the high-side switch is capacitively coupled (CC2) to the substrate, and the conductive structure comprises a capacitor.

According to some embodiments, a capacitance of the capacitor is at least 20-times greater than a capacitance between the low-side switch and the substrate and at least 20-times greater than a capacitance between the high-side switch and the substrate.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A half-bridge circuit, comprising:
   a substrate;
   a monolithic die over the substrate, wherein a low-side switch is integrated with the monolithic die;
   a switch node;
   a high-side switch integrated with the monolithic die and coupled to the switch node; and
   a conductive structure comprising:
   a first terminal coupled to the substrate; and a second terminal coupled to the switch node, wherein a capacitance of at least part of the conductive structure is greater than a capacitance between the low-side switch and the substrate and greater than a capacitance between the high-side switch and the substrate.

2. The half-bridge circuit of claim 1, comprising:
a source region of the high-side switch, wherein the switch node is coupled to the source region of the high-side switch.

3. The half-bridge circuit of claim 1, wherein the monolithic die comprises gallium nitride.

4. The half-bridge circuit of claim 1, wherein the conductive structure is within the monolithic die.

5. The half-bridge circuit of claim 1, wherein the conductive structure is external to the monolithic die.

6. The half-bridge circuit of claim 1, comprising:
a third terminal coupled to the low-side switch.

7. The half-bridge circuit of claim 6, comprising:
a source region of the low-side switch, wherein the substrate is capacitively coupled (CC1) to the source region of the low-side switch.

8. The half-bridge circuit of claim 6, wherein the low-side switch and the high-side switch are laterally conducting field-effect transistors.

9. The half-bridge circuit of claim 6, the at least part of the conductive structure comprising:
a capacitor, wherein:
the capacitor is coupled to the first terminal and the second terminal.

10. The half-bridge circuit of claim 6, the at least part of the conductive structure comprising:
a diode, wherein:
the diode is coupled to the first terminal and the second terminal.

11. The half-bridge circuit of claim 1, wherein the high-side switch comprises a high-electron-mobility transistor.

12. A half-bridge circuit, comprising:
a substrate;
a monolithic die over the substrate;
a high-side switch integrated with the monolithic die, wherein the high-side switch is laterally conducting;
a low-side switch integrated with the monolithic die, wherein the low-side switch is laterally conducting;
a source region of the high-side switch;
a drain region of the low-side switch; and
a switch node, wherein:
the source region of the high-side switch is coupled to the switch node,
the drain region of the low-side switch is coupled to the switch node, and
the switch node is at a first voltage potential that is equal to a second voltage potential of the substrate when at least one of the high-side switch or the low-side switch is on.

13. The half-bridge circuit of claim 12, comprising:
a conductive structure comprising:
a first terminal coupled to the substrate; and
a second terminal coupled to the switch node.

14. The half-bridge circuit of claim 13, wherein:
the conductive structure comprises a capacitor between the first terminal and the second terminal, and
a capacitance of the capacitor is at least 20-times greater than a capacitance between the low-side switch and the substrate and at least 20-times greater than a capacitance between the high-side switch and the substrate.

15. The half-bridge circuit of claim 13, wherein:
the conductive structure comprises a diode between the first terminal and the second terminal, and
a capacitance of the diode is at least 20-times greater than a capacitance between the low-side switch and the substrate and at least 20-times greater than a capacitance between the high-side switch and the substrate.

16. The half-bridge circuit of claim 12, wherein the monolithic die comprises gallium nitride.

17. A half-bridge circuit, comprising:
a substrate;
a monolithic die over the substrate;
a high-side switch integrated with the monolithic die and coupled to a switch node; and
a low-side switch integrated with the monolithic die and coupled to the switch node, wherein:
the switch node is at a first voltage potential that is equal to a second voltage potential of the substrate when at least one of the high-side switch or the low-side switch is on.

18. The half-bridge circuit of claim 17, comprising:
a conductive structure comprising:
a first terminal coupled to the substrate; and
a second terminal coupled to the switch node.

19. The half-bridge circuit of claim 18, wherein:
the low-side switch is capacitively coupled (CC1) to the substrate,
the high-side switch is capacitively coupled (CC2) to the substrate, and
the conductive structure comprises a capacitor.

20. The half-bridge circuit of claim 19, wherein:
a capacitance of the capacitor is at least 20-times greater than a capacitance between the low-side switch and the substrate and at least 20-times greater than a capacitance between the high-side switch and the substrate.

* * * * *